United States Patent [19]

Yamanaka et al.

[11] 4,146,873
[45] Mar. 27, 1979

[54] GRAY CODE READER

[75] Inventors: Masami Yamanaka, Miki; Hiroshi Higuchi, Takasago, both of Japan

[73] Assignee: Yamato Scale Company, Ltd., Japan

[21] Appl. No.: 778,355

[22] Filed: Mar. 17, 1977

[30] Foreign Application Priority Data

Oct. 27, 1976 [JP] Japan .............................. 51-129956

[51] Int. Cl.² ........................................... G06F 11/10
[52] U.S. Cl. ....................... 340/146.1 AG; 340/347 P
[58] Field of Search ................ 340/146.1 AG, 347 M, 340/347 P; 235/61.11 E

[56] References Cited

U.S. PATENT DOCUMENTS

| | | | |
|---|---|---|---|
| 2,713,084 | 7/1955 | Berwin | 340/146.1 AG |
| 3,187,325 | 6/1965 | Waldhauer | 340/347 M |
| 3,548,397 | 12/1970 | Dayton | 340/347 M |
| 3,594,735 | 7/1971 | Furlong | 340/347 M |
| 3,913,095 | 10/1975 | Dlugos | 340/347 P |
| 3,938,083 | 2/1976 | Stansfield | 340/146.1 AG |
| 3,947,843 | 3/1976 | Presentey | 340/347 P |
| 3,999,064 | 12/1976 | Kramer | 340/347 M |
| 4,025,914 | 5/1977 | Akita | 340/347 M |

*Primary Examiner*—Charles E. Atkinson
*Attorney, Agent, or Firm*—Eugene E. Geoffrey, Jr.

[57] ABSTRACT

An analog to digital convertor for converting mechanical motion to an electric digital signal which includes a code plate carrying gray codes for measuring displacement, and codes for parity bits and parity check control bits wherein the parity bits detect the occurrence of a readout error while the parity check control bits detect an incorrect parity check caused by errors in the sensing operation such as dirt, dust, or damaged sensing elements.

2 Claims, 1 Drawing Figure

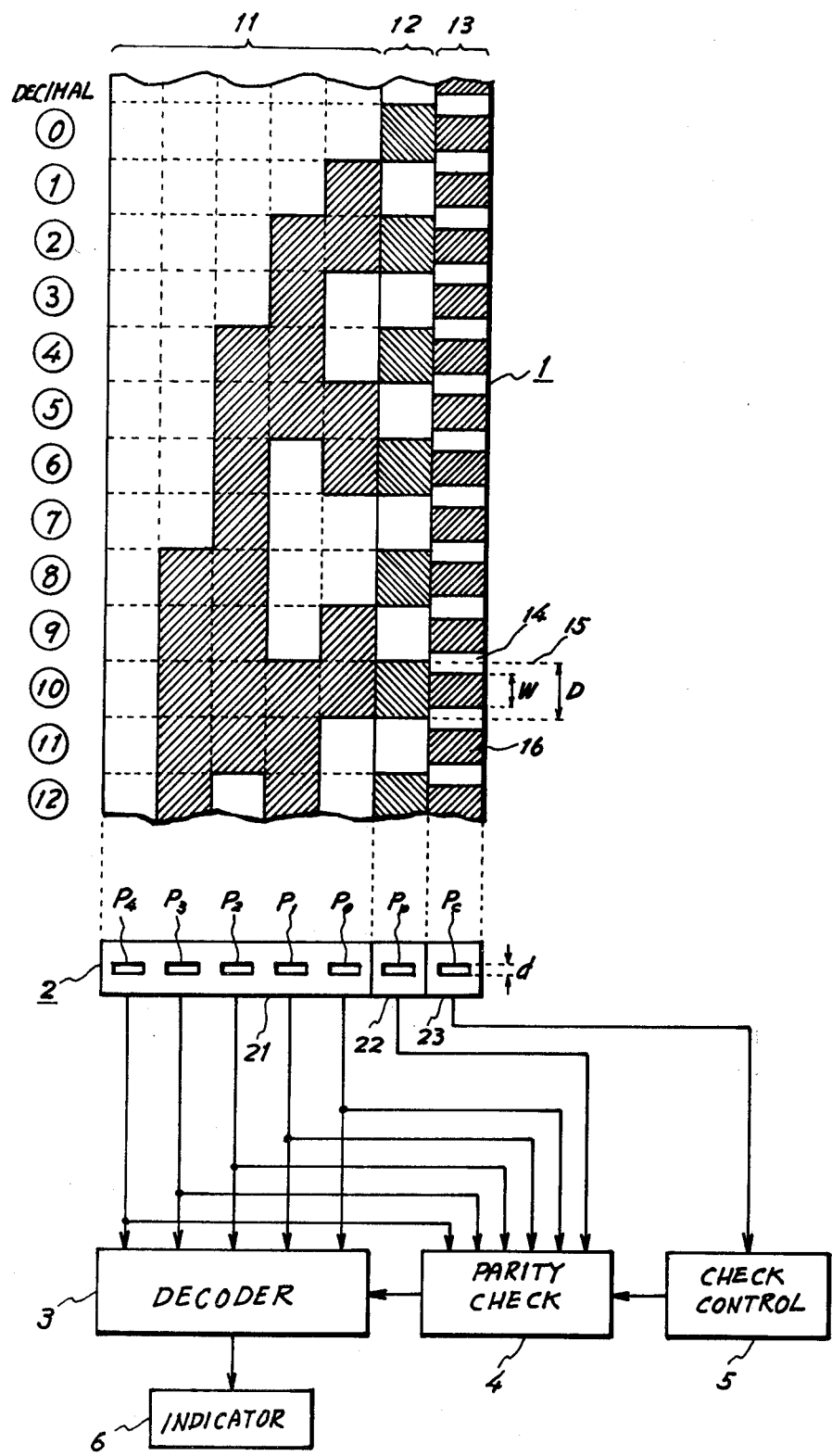

GRAY CODE READER

This invention relates to an improvement in a gray code reader used in an analog-to-digital (A-D) convertor which is especially useful for converting mechanical displacement into an electric digital signal.

As well known in the art, the gray code system has been developed for minimizing read-out error in an A-D convertor and is also referred to as a unit-distance code, cyclic binary code or reflected binary code. Two examples of this code system are shown in the following tables, in which the gray codes are arranged to correspond to a decimal sequence.

TABLE 1

| Decimal Codes | Binary Gray Code — Gray Codes | | | | | | | Parity Bits |
|---|---|---|---|---|---|---|---|---|
| | $2^6$ | $2^5$ | $2^4$ | $2^3$ | $2^2$ | $2^1$ | $2^0$ | |
| 0  | 0 | 0 | 0 | 0 | 0 | 0 | 0 | 1 |
| 1  | 0 | 0 | 0 | 0 | 0 | 0 | 1 | 0 |
| 2  | 0 | 0 | 0 | 0 | 0 | 1 | 1 | 1 |
| 3  | 0 | 0 | 0 | 0 | 0 | 1 | 0 | 0 |
| 4  | 0 | 0 | 0 | 0 | 1 | 1 | 0 | 1 |
| 5  | 0 | 0 | 0 | 0 | 1 | 1 | 1 | 0 |
| 6  | 0 | 0 | 0 | 0 | 1 | 0 | 1 | 1 |
| 7  | 0 | 0 | 0 | 0 | 1 | 0 | 0 | 0 |
| 8  | 0 | 0 | 0 | 1 | 1 | 0 | 0 | 0 |
| 9  | 0 | 0 | 0 | 1 | 1 | 0 | 1 | 0 |
| 10 | 0 | 0 | 0 | 1 | 1 | 1 | 1 | 1 |
| 11 | 0 | 0 | 0 | 1 | 1 | 1 | 0 | 0 |
| 12 | 0 | 0 | 0 | 1 | 0 | 1 | 0 | 1 |
| 13 | 0 | 0 | 0 | 1 | 0 | 1 | 1 | 0 |
| 14 | 0 | 0 | 0 | 1 | 0 | 0 | 1 | 1 |
| 15 | 0 | 0 | 0 | 1 | 0 | 0 | 0 | 0 |
| 16 | 0 | 0 | 1 | 1 | 0 | 0 | 0 | 1 |
| 17 | 0 | 0 | 1 | 1 | 0 | 0 | 1 | 0 |
| 18 | 0 | 0 | 1 | 1 | 0 | 1 | 1 | 1 |
| 19 | 0 | 0 | 1 | 1 | 0 | 1 | 0 | 0 |
| 20 | 0 | 0 | 1 | 1 | 1 | 1 | 0 | 1 |
| 21 | 0 | 0 | 1 | 1 | 1 | 1 | 1 | 0 |
| 22 | 0 | 0 | 1 | 1 | 1 | 0 | 1 | 1 |
| 23 | 0 | 0 | 1 | 1 | 1 | 0 | 0 | 0 |
| 24 | 0 | 0 | 1 | 0 | 1 | 0 | 0 | 1 |
| 25 | 0 | 0 | 1 | 0 | 1 | 0 | 1 | 0 |

TABLE 2

| Decimal Codes | Binary-Coded Decimal Gray Code — Gray Codes | | | | | | | | Parity Bits |
|---|---|---|---|---|---|---|---|---|---|
| | $10^1$ | | | | $10^0$ | | | | |
| | $2^3$ | $2^2$ | $2^1$ | $2^0$ | $2^3$ | $2^2$ | $2^1$ | $2^0$ | |
| 0  | 0 | 0 | 0 | 0 | 0 | 0 | 0 | 0 | 1 |
| 1  | 0 | 0 | 0 | 0 | 0 | 0 | 0 | 1 | 0 |
| 2  | 0 | 0 | 0 | 0 | 0 | 0 | 1 | 1 | 1 |
| 3  | 0 | 0 | 0 | 0 | 0 | 0 | 1 | 0 | 0 |
| 4  | 0 | 0 | 0 | 0 | 0 | 1 | 1 | 0 | 1 |
| 5  | 0 | 0 | 0 | 0 | 1 | 1 | 1 | 0 | 0 |
| 6  | 0 | 0 | 0 | 0 | 1 | 0 | 1 | 0 | 1 |
| 7  | 0 | 0 | 0 | 0 | 1 | 0 | 1 | 1 | 0 |
| 8  | 0 | 0 | 0 | 0 | 1 | 0 | 0 | 1 | 1 |
| 9  | 0 | 0 | 0 | 0 | 1 | 0 | 0 | 0 | 0 |
| 10 | 0 | 0 | 0 | 1 | 1 | 0 | 0 | 0 | 1 |
| 11 | 0 | 0 | 0 | 1 | 1 | 0 | 0 | 1 | 0 |
| 12 | 0 | 0 | 0 | 1 | 1 | 0 | 1 | 1 | 1 |
| 13 | 0 | 0 | 0 | 1 | 1 | 0 | 1 | 0 | 0 |
| 14 | 0 | 0 | 0 | 1 | 1 | 1 | 1 | 0 | 1 |
| 15 | 0 | 0 | 0 | 1 | 0 | 1 | 1 | 0 | 0 |
| 16 | 0 | 0 | 0 | 1 | 0 | 0 | 1 | 0 | 1 |
| 17 | 0 | 0 | 0 | 1 | 0 | 0 | 1 | 1 | 0 |
| 18 | 0 | 0 | 0 | 1 | 0 | 0 | 0 | 1 | 1 |
| 19 | 0 | 0 | 0 | 1 | 0 | 0 | 0 | 0 | 0 |
| 20 | 0 | 0 | 1 | 1 | 0 | 0 | 0 | 0 | 1 |
| 21 | 0 | 0 | 1 | 1 | 0 | 0 | 0 | 1 | 0 |

In the application of such code system to an A-D convertor, a code plate is provided having, for example, a row-and-column array of transparent and opaque squares arranged in the same fashion as the code arrays in the tables, wherein the transparent and opaque squares correspond respectively to "0" and "1" bits. The code plate is arranged to move in the direction of decimal sequence in proportion to the displacement to be detected and a plurality of photoelectric sensing elements are arranged in a row so as to face to the respective bits for distinguishing them. According to a feature of the gray code system, the number of bits varying between the adjoining codes, which is referred as "code distance", is minimum, that is, unity. Accordingly, even when the row of sensing elements is on the boundary between the adjoining codes, no code other than these adjoining codes can be read even if there should be a read-out error. Thus, the read-out error is minimized by the gray code system.

Although the gray code system has such superior feature of high read-out reliability, it cannot overcome read-out errors caused by dust and lint lying on the code plate and photoelectric sensing elements getting out of order. In order to detect such read-out errors, it has been proposed to use a technique of parity check. For example, if the code plate is provided with parity bits added as shown in the above tables, the number of "1" bits appearing in any code becomes odd, including the parity bit. Therefore, if an even number is detected by parity check, this must mean an occurrence of the above mentioned read-out error. Although this method appears effective, it still may have the disadvantage that an incorrect parity check may take place and, for example, an error signal may be produced even when a correct read-out is effected, due to uncertainty of the sensing operation in the vicinity of the boundaries of the codes.

Accordingly, an object of this invention is to provide an improved gray code reader having parity bits for detecting read-out errors caused by dust and lint and damaged sensing elements and also having the function of cancelling the above incorrect parity check. This invention is based upon the idea of interrupting the parity check operation when the sensing elements are in a specific range overlying each boundary.

According to this invention, the gray code reader comprises a code plate carrying gray codes, gray code reading means arranged in one-to-one correspondence with the bits of said gray codes for reading said gray codes and a decoder coupled to the outputs of said reading means for decoding the gray codes as read out. The code plate further carries parity bits and parity check control bits arranged side by side with said gray codes and said parity check control bits consist of first bits lying across the respective boundaries of said gray codes and second bits occupying the remaining portions between said first bits. The gray code reader of this invention further comprises parity bit reading means and parity check control bit reading means arranged in correspondence with said parity bits and said parity check control bits respectively for reading said bits, a parity check circuit coupled to the outputs of said gray code reading means and parity bit reading means for effecting the parity check operation, and a parity check control circuit coupled to the output of said parity check control bit reading means for interrupting said parity check operation in response to read-out of said first bit.

These and other objects and features of this invention will be described in more detail hereinunder with reference to the accompanying drawing.

The single drawing shows a schematic representation of an embodiment of gray code reading arrangement according to this invention.

In the drawing, a code plate 1 consists of a gray code portion 11, a parity bit portion 12 and a parity check control bit portion 13. In each portion, the shadowed regions are opaque and correspond to "1" bits and the blank regions are transparent and correspond to "0" bits. The gray codes and parity bits in this drawing are arranged in accordance with those in Table 1. As shown in the drawing, all bits are arranged in complete row-and-column or checkerboard array throughout the portions 11 and 12, while the bits are arranged in somewhat different fashion in the portion 13. More specifically, in this portion 13, narrow "0" bits 14 are disposed across respective boundaries 15 of the gray codes and the remaining portions 16 between these "0" bits are occupied by "1" bits.

Just behind the code plate 1 there is disposed a photoelectric sensing device 2 which consists of a gray code sensing section 21, a parity bit sensing section 22 and a parity check control bit sensing section 23. The section 21 has five photoelectric sensing elements such as photocells having light receiving windows or slits P4, P3, P2, P1 and P0, respectively, and the sections 22 and 23 have similar sensing elements having windows Pp and Pc, respectively. The windows P4, P3, P2, P1 and P0 are disposed to face to the digits $2^4$, $2^3$, $2^2$, $2^1$ and $2^0$ of the gray code 11, respectively, and the windows Pp and Pc are disposed to face to the parity bits 12 and the parity check control bits 13, respectively. In order to minimize read-out error, it is desired that these windows are precisely dimensioned with a width d and aligned on a straight line. It is further desired that the width d is related to the distance D of the code boundaries 15 and the width W of the "1" bit of the parity check control bit 16 by the following equation.

$$d \leq D - W$$

A light source, which is not shown in the drawing, is provided in front of the code plate 1 and arranged to uniformly illuminate all the windows of the sensing elements through the code plate 1. Each sensing element produces an output when it senses a light from the light source.

The outputs of the sensing elements of the section 21 are applied to a decoder circuit 3 and also to a parity check circuit 4 which receives also the output of the sensing element of the section 22. The output of the sensing element of the section 23 is applied to a parity check control circuit 5. The output of the parity check control circuit 5 is coupled to the parity check circuit 4 and the output of the parity check circuit 4 is coupled to the decoder circuit 3. The output of the decoder circuit 3 is supplied to a utilization device such as an indicator 6.

When the device of this invention as described above is applied to a utilization device, the code plate 1 is interlocked with a member of the utilization device, which exhibits a displacement to be detected, for example, a cradle of a spring balance, so that it moves with that member in proportion to that displacement in the vertical direction of the drawing.

When the window or slit Pc of the parity check control bit sensing section 23 faces a "1" bit of the parity check control bits 13 during the movement of the code plate 1, no output is supplied from the section 23 to the parity check control circuit 5 and the latter is not actuated. Therefore, the decoded circuit 3 and the parity check circuit 4 execute their regular operations based upon the outputs of the gray code sensing section 21 and the parity bit sensing section 22. More particularly, the decoder circuit 3 decodes the gray code sensed by the section 21 and the indicator 6 display a decimal code indicating the corresponding displacement, while the parity check circuit 4 checks parity of the number of "1" bits from the outputs of the sections 21 and 22 and applies a signal to the decoder circuit 3 to interrupt its operation when the parity is even. Accordingly, the decoder circuit 3 is rendered inactive and the indicator 6 gives no indication, even if any "0" bit is sensed erroneously as "1" due to dust or lint lying on the "0" bit region or by a damaged or inactive sensing element.

When the window or slit Pc of the section 23 faces to "0" bit 14 of the parity check control bits 13, the sensing section 23 supplies an output to the parity check control circuit 5. In response to this output, the parity check control circuit 5 produces a control signal and supplies it to the parity check circuit 4 to interrupt its operation. During this time, therefore, no parity check is executed and the indicated value may include a read-out error caused by dust or lint on the code plate 1 or a damaged or inactive sensing element. On the contrary, however, no error must come from the parity bits and, if a read-out error should happen, it would be only one unit because the indication is based upon the gray code 11 only.

As the parity check operation is interrupted even when a part of the window Pc of the section 23 enters the "0" bit region 14, it seems that the error detecting power of the gray code reader is reduced below W/D times that available without use of the control bits 13. However, this power can be maintained by providing the decoder circuit 3 with means for temporarily holding the incoming signal from the parity check circuit 4. As the "1" bit region 16 passes across the window Pc invariably before the "0" bit region comes over the window Pc, the error detected during passage of the "1" bit region 16 is stored in this holding means and the decoder 3 is maintained inactive and no indication is given even when the window Pc comes in the "0" bit region 14 and the parity check circuit 4 is rendered inactive by the control circuit 5, if the holding time is selected adequately. This is expecially effective when a sensing element has become out of order.

As described above, according to this invention, an improved gray code reader in which all causes of read-out error which can be anticipated have been cancelled. The gray code reader of this invention is especially useful in A-D convertors of precision measuring equipment such as weighing balances and the like.

It should be noted that the above description has been made with reference to a specific embodiment for explanation purposes only and various modifications can be made without departing from the scope of this invention. For example, the photoelectric sensing system may be substituted with an electric, magnetic or other sensing system by suitably modifying the code plate. A magnetic sensing system appears more advantageous since it is substantially insensitive to dust and lint lying on the code plate. While, in the above embodiment, the output of the parity check circuit 4 is connected to the decoder 3, it may be applied to a separate alarm device to produce a visual and/or audible alarm and thus indicate that an erroneous condition has taken place.

What is claimed is:

1. A gray code reader comprising a code plate carrying grade codes, gray code reading means arranged in one-to-one correspondence with the bits of said gray codes for reading said gray codes and a decoder coupled to the outputs of said reading means for decoding the gray codes as read out, said code plate further carrying a parity bit gray code and a parity check control bit gray code arrange side by side with the first said gray codes, said parity check control bit gray code consisting of first bits or areas lying respectively across the boundaries of said parity bit gray code and second bits or areas occupying the remaining portions between the first said parity control bits or areas and said gray code reader further comprises parity bit gray code reading means and parity check control bit reading means arranged in correspondence with said parity bit gray code and said parity check control bit gray code producing parity bits and parity check control bits, a parity check circuit coupled to the outputs of said gray code reading means and parity bit reading means for executing parity check operation, and a parity check control circuit coupled to the output of said parity check control bit reading means for interrupting said parity check operation in response to read-out of the first bit by said parity check control bit reading means.

2. A gray code reader according to claim 1 wherein the following equation is fulfilled:

$$d \leq D - W$$

where $d$ is the effective width of said parity check control bit reading means, which is substantially equal to effective widths of said gray code reading means and parity bit reading means, D is the interval of said boundaries and W is the width of said second bit of said parity check control bit.

* * * * *